United States Patent [19]

Marchisi et al.

[11] Patent Number: 4,711,023
[45] Date of Patent: Dec. 8, 1987

[54] PROCESS FOR MAKING SINGLE-IN-LINE INTEGRATED ELECTRONIC COMPONENT

[75] Inventors: Giuseppe Marchisi; Carlo Cognetti De Martiis, both of Milan, Italy

[73] Assignee: SGS-Antes Componenti Elettronici S.p.A., Catania, Italy

[21] Appl. No.: 941,336

[22] Filed: Dec. 15, 1986

Related U.S. Application Data

[62] Division of Ser. No. 701,221, Feb. 13, 1985, Pat. No. 4,649,460.

[30] Foreign Application Priority Data

Feb. 17, 1984 [IT] Italy ............................... 19668 A/84

[51] Int. Cl.[4] ........................................... H01R 43/00
[52] U.S. Cl. ...................................... 29/827; 437/209; 437/220
[58] Field of Search ............... 29/588, 589, 827, 576 S

[56] References Cited

U.S. PATENT DOCUMENTS

| | | | |
|---|---|---|---|
| 3,581,387 | 6/1971 | Buck et al. | 29/589 X |
| 4,012,765 | 3/1977 | Lehner et al. | 29/589 X |
| 4,451,973 | 6/1984 | Tateno et al. | 29/588 |
| 4,637,130 | 1/1987 | Fujii et al. | 29/588 |
| 4,649,637 | 3/1987 | Hatakeyama | 29/576 S |

Primary Examiner—Howard N. Goldberg
Assistant Examiner—Carl J. Arbes
Attorney, Agent, or Firm—Cushman, Darby & Cushman

[57] ABSTRACT

Method for making an insulating package premolded on a metallic frame with electrical contacts containing in an inner space a semiconductor chip which rests on a thermic dissipator and is connected to the electrical contacts. The inner space of the package is closed on top by a cover provided with a lateral extension with a bent end, which operates not only as a cover, but also as a means for fastening and thrusting the package toward a support surface.

2 Claims, 3 Drawing Figures

PROCESS FOR MAKING SINGLE-IN-LINE INTEGRATED ELECTRONIC COMPONENT

This is a division of application Ser. No. 701,221, filed Feb. 13, 1985, now U.S. Pat. No. 4,649,460, issued Mar. 10, 1987.

BACKGROUND OF THE INVENTION

The present invention relates to a single-in-line integrated electronic component and to a process for manufacturing the same.

It is known that the usual integrated electronic components include a container or package of epoxy and/or silicone thermosetting resin, made by molding around a metallic frame previously provided with a thermic dissipator and with a semiconductor wafer or "chip".

These known electronic components, commonly called "molded", show several drawbacks as regards the cost and the performance (reliability and quality):

(a) possibility of breakage and/or damage of the semiconductor wafer, due to the fact that the molding and subsequent operation (separation of the several frame units from a single initial metallic strip or "cropping", polishing of the contacts from the resin flashes or "deflashing") are carried out in presence of the semiconductor wafer;

(b) degrading effects (of mechanical, chemical, thermal type) induced by the resin on the wafer;

(c) poor versatility, since every structural change involves valuable alterations of the molds for the shearing of the metallic frame and the molding of the resin package;

(d) reduced possibility of carrying out automatically the final testing and marking processes, which are to be carried out on the single components already separated from each other;

(e) problems for the fastening of the inner dissipator of the component to the common outer dissipator, this causing presently a partial raising of the component which complicates and makes longer the thermic heat dissipation path.

There are on the market, on the other hand, so-called "pre-molded" electronic components, in which the dissipator and the semiconductor wafer or chip, and then a resin cover or cap, are applied in a suitable space provided inside a resin package previously molded on the metallic frame.

These components are however known only in the "dual-in-line" embodiment, that is with electric contacts coming out from two opposed sides of the package.

Object of the present invention, on the contrary, is to realize an integrated electronic component of the "single-in-line" type, that is with electric contacts coming out from one side of the package.

Another object of the present invention is to realize a single-in-line electronic component, which is exempt from the above indicated drawbacks of the present "molded" components.

Still another object of the present invention is to realize a single-in-line electronic component, which offers an original and efficient solution of the problem of the fastening of the component to the outer dissipator.

According to the invention such objects are reached by a single-in-line integrated electronic component, characterized in that it comprises an insulating package pre-molded on a metallic frame provided with electric contacts, a thermic dissipator, a semiconductor chip housed in a space of said package on said thermic dissipator and electrically connected to said contacts, and an insulating cover arranged to close said space and provided with a bent lateral extension for fastening and thrusting the component towards a support surface. Otherwise stated, the electronic component according to the invention therefore represents the application of the "pre-molding" art (that is the previous molding of the resin package) to a "single-in-line" component, with the important addition of the provision of a cover which has also the function of providing the fastening and the correct thrusting of the component towards the support surface, that is towards the outer dissipator.

There result the following important advantages with respect to the presently used "molded" components:

(a) the three parts which form the package ("premolded" frame, dissipator and cover) may be treated separately;

(b) the dangerous operations are carried out while the semiconductor chip is absent;

(c) the resin is not in close contact with the chip;

(d) the versatility is high and the changes involve low costs;

(e) the fastening by means the same package closing cover allows the component to be kept well adherent to the support surface, this helping the direct heat dissipation through the shortest way.

Still according to the invention there is further provided a process for manufacturing the above said component, which after the usual preparation of a strip of metallic frames (one for each component) made integral with each other by metallic connecting tongues, includes the molding, on said frames, of respective insulating packages made integral with each other by insulating bridges destined by being cut only at the end of the process.

Once the dissipator, the semiconductor chip and the cover have been applied and the cutting of the metallic frame connecting tongues ("cropping") has been carried out, this obviously allows to prosecute the several testing and marking operations with the several components electrically separated but mechanically connected to each other, with consequent possibility of complete automation of the entire process and particularly of the above said final operations.

BRIEF DESCRIPTION OF THE DRAWING

The features and advantages of the present invention will be made more apparent by the following detailed description made by way of example only with reference to the enclosed drawings, in which.

EXEMPLARY EMBODIMENT

Figure 1:
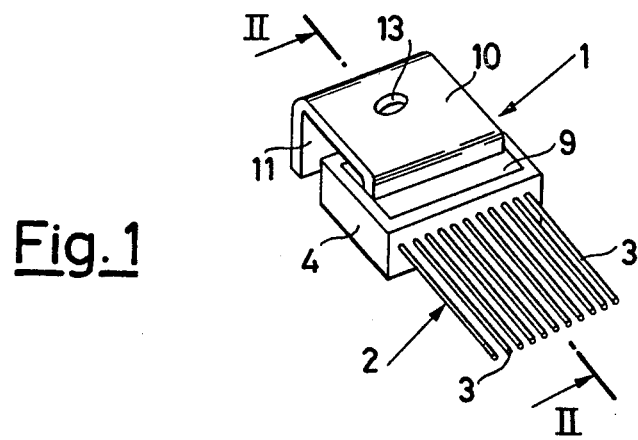
FIG. 1 shows in perspective view en embodiment of the component according to the invention.
Figure 2:
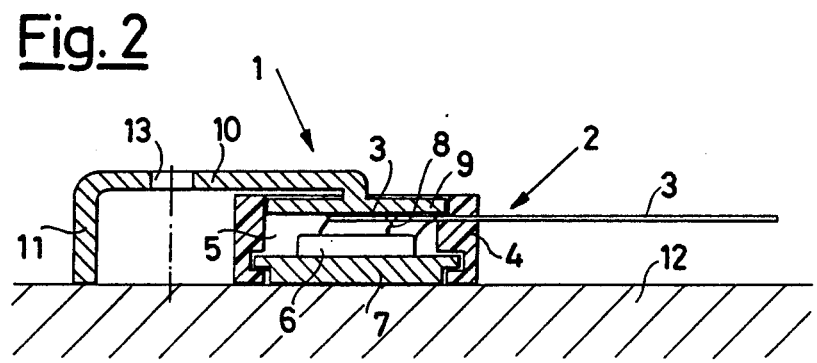
FIG. 2 shows said component in section along line II—II of FIG. 1.

With reference to FIGS. 1 and 2, there is shown an integrated electronic component of single-in-line type, which is indicated in its entirity with the numeral 1.

It includes a metallic frame 2, which defines a plurality of single electric contacts 3, all arranged on a same side of the component.

On a portion of said metallic frame 2 there is molded a thermoplastic resin package 4, which defines a rectangular space 5.

As illustrated in FIG. 2, there is housed in the space 5 a semiconductor wafer or chip 6, which rests on a metallic thermic dissipator 7 arranged to close the space 5 downwards. Very thin metallic wires 8 connect the chip 6 to the contacts 3.

The space 5 is then closed upwards by a thermoplastic resin cover 9, which is fastened to the package 4 and is provided with a lateral extension 10 with an end bending 11 towards the component support surface 12 (substantially, the outer dissipator). A bore 13 of the lateral extension 10 allows the passage of a suitable fixing screw, which, by pressing the package 4 through the cover 9 against the support surface 12, assures both the locking and the correct thrusting of the package against said surface. The direct dissipation of heat from the inner dissipator 7 to the surface 12 is thus made easier.

Figure 3:
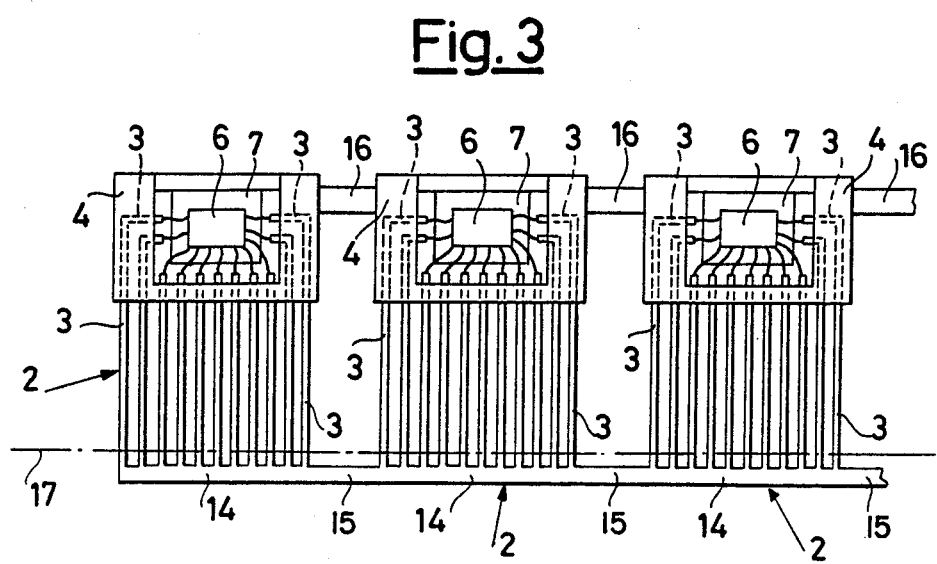
FIG. 3 shows in top plan a strip of pre-molded components during the manufacturing process according to the invention.

The process for manufacturing the component of FIGS. 1 and 2 may be easily understood by referring to FIG. 3. In this figure it is shown that the several frames 2 are initially prepared as a single continuous strip having the same frames made integral with each other by metallic connecting tongues 14, which extend similar connecting strips 15 for the free end of the contacts 3. On the single frames 2 there are then molded respective resin packages 4, which are in their turn made integral with each other by resin connecting bridges 16. The single packages are then provided with the dissipator 7 and the semiconductor chip 6, which is electrically connected to the contacts 3 by means of electric wires 8.

At this point, having reached the condition illustrated in FIG. 3, the cover 9 is added and the electric separation of the several components is carried out by cutting the metallic tongues 14, as illustrated in dash-dot line 17 in FIG. 3.

The several components however still remain mechanically connected to each other through the resin bridges 16. After the mutual separation of the same contacts 3 by removal of the connecting strips 15, this makes possible the automatic execution of the final operations of the process, particularly of the electric testing and marking operations.

What is claimed is:

1. A process for making a single-in-line integrated electronic component comprising:
   providing a metallic frame with electric contacts,
   molding an insulating package on said metallic frame to form an inner space,
   providing a heat dissipator at the bottom of said inner space,
   mounting a semiconductor chip on said heat dissipator in said inner space and electrically connecting said semiconductor chip to said contacts, and
   arranging an insulating cover at the top of said inner space, said insulating cover being provided with a lateral extension having a turned end flush with the package bottom and at least one bore for the passage of a fastening means for the fastening of the component to a support surface.

2. A process for making a single-in-line electronic component comprising:
   a. providing a metallic frame including a plurality of conducting strips parallel to one another over a portion of their length, said conducting strips being connected to one another at some point along their length;
   b. premolding an insulating package to said metallic frame so that said package forms a box-like structure with an open inner space;
   c. locating a heat dissipator near the bottom of said inner space and connecting said heat dissipator to said package so as to close the bottom of said inner space and also connecting said heat dissipator so that when said insulating package is pushed downward against a plane, said dissipator is securely pushed flush against said plane;
   d. mounting a semiconductor chip on said heat dissipator and electrically connecting said chip to said metallic frame such that said conducting strips are capable of acting as conductors between said chip and external contacts to which said chip may be connected;
   e. locating an insulating cover near the top of said inner space and connecting said cover near to the top of said insulating package, said cover,
      (1) including lateral extension means, adapted for connection to an external surface so that connection of said extension means to said external surface causes said insulating cover means to push said insulating package and thus said heat dissipator against said surface,
      (2) being connected to said insulating package so that attempting to push said cover downward against a plane also causes said insulating package to be pushed toward said plane.

* * * * *